(12) United States Patent
Yakunin et al.

(10) Patent No.: US 9,366,967 B2
(45) Date of Patent: Jun. 14, 2016

(54) RADIATION SOURCE

(75) Inventors: Andrei Mikhailovich Yakunin, Mierlo (NL); Vladimir Vitalevich Ivanov, Moscow (RU); Vladimir Mihailovitch Krivtsun, Troitsk (RU); Viacheslav Medvedev, Moscow (RU); Gerardus Hubertus Petrus Maria Swinkels, Eindhoven (NL); Jan Bernard Plechelmus Van Schoot, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 103 days.

(21) Appl. No.: 14/241,364

(22) PCT Filed: Aug. 1, 2012

(86) PCT No.: PCT/EP2012/065037
§ 371 (c)(1),
(2), (4) Date: May 23, 2014

(87) PCT Pub. No.: WO2013/029906
PCT Pub. Date: Mar. 7, 2013

(65) Prior Publication Data
US 2014/0368802 A1  Dec. 18, 2014

Related U.S. Application Data

(60) Provisional application No. 61/530,684, filed on Sep. 2, 2011.

(51) Int. Cl.
*G03B 27/32* (2006.01)
*G03B 27/54* (2006.01)
(Continued)

(52) U.S. Cl.
CPC ............ *G03F 7/70033* (2013.01); *H05G 2/006* (2013.01); *H05G 2/008* (2013.01); *H05G 2/005* (2013.01)

(58) Field of Classification Search
CPC ............ G03F 7/70008; G03F 7/70033; G03F 7/70041; G03F 7/70055; G03F 7/70558; G03F 7/70916; H05G 2/00–2/008
USPC ............ 250/492.1–493.1, 504 R; 355/30, 53, 355/67–70, 77
See application file for complete search history.

(56) References Cited

U.S. PATENT DOCUMENTS

2006/0039435 A1  2/2006 Cheymol et al.
2006/0140227 A1  6/2006 Rocca et al.
(Continued)

FOREIGN PATENT DOCUMENTS

CN  101690419 A  3/2010
EP  1 492 394 A2  12/2004
(Continued)

OTHER PUBLICATIONS

International Search Report directed to related International Patent Application No. PCT/EP2012/065037, mailed Nov. 15, 2012; 5 pages.
(Continued)

*Primary Examiner* — Colin Kreutzer
(74) *Attorney, Agent, or Firm* — Sterne, Kessler, Goldstein & Fox P.L.L.C.

(57) ABSTRACT

A radiation source (60) suitable for providing a beam of radiation to an illuminator of a lithographic apparatus. The radiation source comprises a nozzle configured to direct a stream of fuel droplets (62) along a trajectory (64) towards a plasma formation location (66). The radiation source is configured to receive a first amount of radiation (68) such that the first amount of radiation is incident on a fuel droplet (62a) at the plasma formation location, and such that the first amount of radiation transfers energy into the fuel droplet to generate a modified fuel distribution (70), the modified fuel distribution having a surface. The radiation source is also configured to receive a second amount of radiation (72) such that the second amount of radiation is incident on a portion of the surface (70a) of the modified fuel distribution, the second amount of radiation having a p-polarized component with respect to the portion of the surface; and such that the second amount of radiation transfers energy to the modified fuel distribution to generate a radiation generating plasma, the radiation generating plasma emitting a third amount of radiation (74). The radiation source further comprises a collector (CO) configured to collect and direct at least a portion of the third amount of radiation. The radiation source is configured such that the second amount of radiation propagates in a first direction, the first direction being non-parallel to a normal to the portion of the surface of the modified fuel distribution.

13 Claims, 4 Drawing Sheets

(51) Int. Cl.
*G03F 7/20* (2006.01)
*H05G 2/00* (2006.01)

(56) References Cited

U.S. PATENT DOCUMENTS

| | | |
|---|---|---|
| 2006/0215712 A1 | 9/2006 | Ziener et al. |
| 2007/0007469 A1 | 1/2007 | Murakami et al. |
| 2008/0149862 A1* | 6/2008 | Hansson ............... H05G 2/003 250/504 R |
| 2009/0040492 A1 | 2/2009 | Ivanov et al. |
| 2009/0250637 A1 | 10/2009 | Akins et al. |
| 2010/0078579 A1 | 4/2010 | Endo et al. |
| 2010/0117009 A1 | 5/2010 | Moriya et al. |
| 2010/0181503 A1* | 7/2010 | Yanagida ............ G03F 7/70033 250/504 R |
| 2012/0146507 A1 | 6/2012 | Yanagida et al. |
| 2012/0243566 A1 | 9/2012 | Hori et al. |

FOREIGN PATENT DOCUMENTS

| | | |
|---|---|---|
| JP | 2006-172898 A | 6/2006 |
| JP | 2006-228998 A | 8/2006 |
| WO | WO 2011/102277 A1 | 8/2011 |

OTHER PUBLICATIONS

International Preliminary Report on Patentability and Written Opinion of the International Searching Authority directed to related International Patent Application No. PCT/EP2012/065037, mailed Mar. 4, 2014; 11 pages.

Anand, M., et al., "Hard X-ray generation from microdroplets in intense laser fields," Applied Physics B, vol. 81, 2005; pp. 469-477.
Fujioka, S., et al., "Pure-tin microdroplets irradiated with double laser pulses for efficient and minimum-mass extreme-ultraviolet light source production," Applied Physics Letters, vol. 92, No. 24. 2008; pp. 241502-1 to 241502-3.
Hassanein, A., et al., "Combined effects of prepulsing and target geometry on efficient extreme ultraviolet production from laser produced plasma experiments and modeling," Journal of Micro/Nanolithography, MEMS, and MOEMS, vol. 10, No. 3, Jul.-Sep. 2011; pp. 033002-1 to 033002-6.
Pearlman, J.S., et al., "Angular Dependence of Polarization-Related Laser-Plasma Absoprtion Processes," Physical Review Letters, vol. 39, No. 3, Jul. 18, 1977; pp. 140-142.
Rettig, C.L., et al., "Efficency and sealing of an ultrashort-pulse high-repetition-rate laser-driven X-ray source," Applied Physics B, vol. 93, 2008; pp. 365-372.
Teubner, U., et al., "Soft-x-ray radiation from plasmas produced by obliqely incident subpicosecond laser pusles," Physical Review E, vol. 50, No. 5, Nov. 1994; pp. R3334-R3337.
Zhang, J., et al., "Generation and propagation of hot electrons in laser-plasmas," Applied Physics B, vol. 80, No. 8, 2005; pp. 957-971.
Zhang, J., et al., "Studies of Interactions of Femtosecond Laser Pulses with Foil Targets," Journal of Korean Physical Society, vol. 39, No. 5, Nov. 2001; pp. 825-830.
English-Language Abstract for Japanese Patent Publication No. 2006-172898 A, published Jun. 29, 2006; 1 page.
English-Language Abstract for Japanese Patent Publication No. 2006-228998 A, published Aug. 31, 2006; 1 page.

* cited by examiner

RADIATION SOURCE

CROSS-REFERENCE TO RELATED APPLICATIONS

This application claims the benefit of U.S. provisional application 61/530,684, which was filed on 2 Sep. 2011, and which is incorporated herein in its entirety by reference.

FIELD

The present invention relates to a radiation source. The present invention further relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as droplets or particles of a suitable material (e.g., tin), or a stream of a suitable gas or vapor, such as Xe gas or Li vapor. The laser beam which is directed at the fuel is orientated perpendicular to the surface of the fuel so as to maximise the amount of energy that is absorbed by the fuel. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Using the LPP source described above to output radiation (such as EUV radiation) has been found to be fairly inefficient. One measure of the efficiency of an LPP source is its conversion efficiency (CE). One measure of CE is the ratio between energy radiated by the LPP source within a 2% bandwidth around the desired output wavelength, and the input energy supplied to the LPP source. The largest experimental values of CE the applicant has achieved with the LPP source described above operating to produce EUV radiation are less than 5%, and in some cases 3-3.5%.

One of the reasons using the LPP source is this inefficient is because there is poor coupling of the laser into the fuel. That is to say, the absorption of the laser radiation by the fuel is low. In some cases less than 50% of the laser radiation is absorbed by the fuel. Low absorption of the laser radiation by the fuel not only reduces the amount of output radiation produced by the plasma, but it also means that a significant proportion of the laser radiation is reflected or transmitted by the plasma. Laser radiation which is reflected or transmitted by the plasma may pass from the source collector module into portions of the lithographic apparatus which are downstream of the source collector module (such as the substrate). Laser radiation which passes from the source collector module into portions of the lithographic apparatus which are downstream of the source collector module may be referred to as out of band (OoB) radiation. OoB radiation may reduce the imaging performance of the lithographic apparatus and/or may lead to heating of portions of the lithographic apparatus which results in damage to the lithographic apparatus.

SUMMARY

It is desirable to obviate or mitigate at least one problem of the prior art, whether identified herein or elsewhere, or to provide an alternative to existing apparatus or methods.

According to a first aspect of the present invention, there is provided a radiation source suitable for providing a beam of radiation to an illuminator of a lithographic apparatus, the radiation source comprising a nozzle configured to direct a stream of fuel droplets along a trajectory towards a plasma formation location, and the radiation source being configured to receive a first amount of radiation such that the first amount of radiation is incident on a fuel droplet at the plasma formation location, and such that the first amount of radiation transfers energy into the fuel droplet to generate a modified fuel distribution, the modified fuel distribution having a surface. The radiation source being configured to receive a second amount of radiation such that the second amount of radiation is incident on a portion of the surface of the modified fuel distribution, the second amount of radiation having a p-polarized component with respect to the portion of the surface, and such that the second amount of radiation transfers energy to the modified fuel distribution to generate a radiation generating plasma. The radiation generating plasma emitting a third amount of radiation, the radiation source further comprising a collector configured to collect and direct at least a portion of the third amount of radiation, wherein the radiation source is configured such that the second amount of radiation propagates in a first direction, the first direction being non-parallel to a normal to the portion of the surface of the modified fuel distribution.

The radiation source may comprise at least one secondary radiation source, the at least one secondary radiation source generating the first and second amounts of radiation.

The at least one secondary radiation source may comprise a first secondary radiation source and a second secondary radiation source, the first secondary radiation source being configured to generate the first amount of radiation and the second secondary radiation source configure to generate the second amount of radiation.

The at least one secondary radiation source comprises a CO2 or YAG laser.

The radiation source may be configured such that the angle between the first direction and the normal to the portion of the surface of the modified fuel distribution is between about 10° and about 30°.

The radiation source may be configured such that the second amount of radiation is one of linearly p-polarized, circularly polarized or randomly polarized.

The radiation source may be configured such that the modified fuel distribution is generally disk shaped and the portion of the surface of the modified fuel distribution is generally planar.

The radiation source may be configured such that the modified fuel distribution is generally conical or of a generally spherical cap shape, the portion of the surface modified fuel distribution being a generally conical surface or is generally the surface of a spherical cap respectively.

The fuel droplets may comprise xenon, tin or lithium.

It will be appreciated that each of the statements of invention which depend from the first aspect of the present invention, and which are described in the preceding eight paragraphs, may also be applicable and therefore depend from the second and third aspects of the present invention described below.

According to a second aspect of the present invention, there is provided a lithographic apparatus arranged to project a pattern from a patterning device onto a substrate, wherein the lithographic apparatus comprises at least one secondary radiation source and a radiation source configured to provide a beam of radiation to the patterning device along an optical axis, the radiation source comprising a nozzle configured to direct a stream of fuel droplets along a trajectory towards a plasma formation location, and the radiation source being configured to receive a first amount of radiation from the at least one secondary radiation source such that the first amount of radiation is incident on a fuel droplet at the plasma formation location, and such that the first amount of radiation transfers energy into the fuel droplet to generate a modified fuel distribution, the modified fuel distribution having a surface, the radiation source being configured to receive a second amount of radiation from the at least one secondary radiation source such that the second amount of radiation is incident on a portion of the surface of the modified fuel distribution, the second amount of radiation having a p-polarized component with respect to portion of the surface, and such that the second amount of radiation transfers energy to the modified fuel distribution to generate a radiation generating plasma, the radiation generating plasma emitting a third amount of radiation, the radiation source further comprising a collector configured to collect and direct at least a portion of the third amount of radiation along the optical axis towards the patterning device, wherein the radiation source is configured such that the second amount of radiation propagates in a first direction, the first direction being non-parallel to a normal to the portion of the surface of the modified fuel distribution.

The normal to the portion of the surface of the modified fuel distribution may be parallel to the optical axis.

The first direction may be parallel to the optical axis.

The first direction may be co-axial with the optical axis.

According to a third aspect of the present invention, there is provided a device manufacturing method using a lithographic apparatus, the lithographic apparatus comprising at least one secondary radiation source, a patterning device and a radiation source having nozzle, a plasma formation location and a collector, the method comprising directing a stream of fuel droplets from the nozzle along a trajectory towards the plasma formation location, producing a first amount of radiation from the at least one radiation source such that the first amount of radiation is incident on a fuel droplet at the plasma formation location, transferring energy from the first amount of radiation into the fuel droplet to generate a modified fuel distribution, the modified fuel distribution having a surface, producing a second amount of radiation having a p-polarized component with respect to a portion of the surface from the at least one radiation source such that the second amount of radiation is incident on the portion of the surface of the modified fuel distribution, transferring energy from the second amount of radiation to the modified fuel distribution to generate a radiation generating plasma, the radiation generating plasma emitting a third amount of radiation, collecting at least a portion of the third amount of radiation at the collector to produce a radiation beam, directing the radiation beam from the collector along an optical axis towards the patterning device, producing a patterned radiation beam using the patterning device, and projecting the patterned radiation beam onto a substrate, wherein the second amount of radiation propagates in a first direction, the first direction being non-parallel to a normal to the portion of the surface of the modified fuel distribution.

The device manufacturing method may additionally comprise determining the angle between the first direction and the normal to the portion of the surface of the modified fuel distribution at which a maximum amount of energy is transferred from the second amount of radiation to the modified fuel distribution due to plasma resonance, and producing a second amount of radiation such that the second amount of radiation propagates in the first direction, the angle between the first direction and the normal to the portion of the surface of the modified fuel distribution being the angle between the first direction and the normal to the portion of the surface of the modified fuel distribution at which a maximum amount of energy is transferred from the second amount of radiation to the modified fuel distribution due to plasma resonance.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
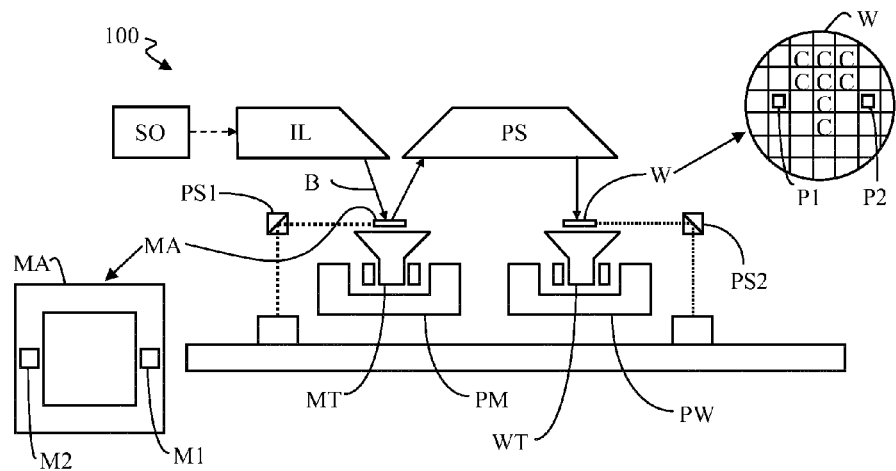
FIG. 1 depicts a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus 100 including a radiation source, in this case a source collector module SO according to one embodiment of the present invention. The apparatus comprises an illumination system (illuminator) IL configured to condition a radiation beam B (e.g., EUV radiation), a support structure (e.g., a mask table) MT constructed to support a patterning device (e.g., a mask or a reticle) MA and connected to a first positioner PM configured to accurately position the patterning device, a substrate table (e.g., a wafer table) WT constructed to hold a substrate (e.g., a resist-coated wafer) W and connected to a second positioner PW configured to accurately position the substrate, and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel with a laser beam. Fuel may for example be a droplet, stream or cluster of material having the required line-emitting element. The source collector module SO may be part of an EUV radiation system including a laser, not shown in FIG. 1, for providing the laser beam which excites the fuel. The resulting plasma emits output radiation, e.g., EUV radiation, which is collected using a radiation collector located in the source collector module. The laser and the source collector module may be separate entities, for example when a $CO_2$ laser is used to provide the laser beam for fuel excitation. In such cases, the laser is not considered to form part of the lithographic apparatus, and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
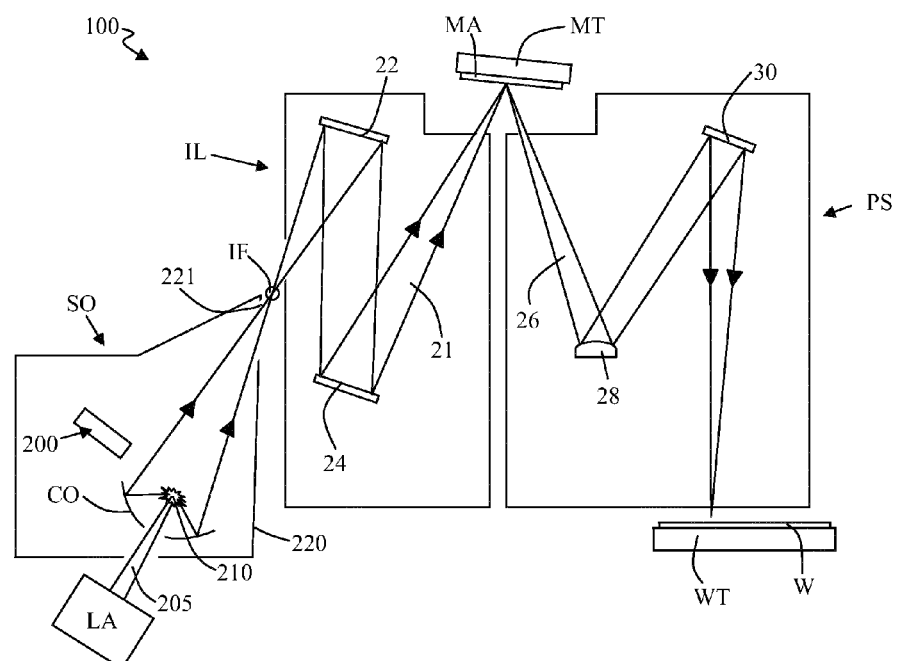
FIG. 2 depicts the lithographic apparatus of FIG. 1 in more detail.

FIG. 2 shows the apparatus 100 in more detail, including a radiation source (the source collector module SO), the illumination system IL, and the projection system PS. The source collector module SO is constructed and arranged such that a vacuum environment can be maintained in an enclosing structure 220 of the source collector module SO.

A laser LA is arranged to deposit laser energy via a laser beam 205 into a fuel, such as xenon (Xe), tin (Sn) or lithium (Li) which is provided from a fuel supply 200, thereby creating a highly ionized plasma 210 with electron temperatures of several 10's of eV. The energetic output radiation generated during de-excitation and recombination of these ions is emitted from the plasma, collected and focussed by a near normal incidence collector optic CO. In the embodiments described below, the fuel is tin (Sn).

The greater the proportion of the energy of the radiation (e.g., laser beam) which is incident on the fuel which is absorbed by the fuel, the greater the energy of the plasma will be and hence the greater amount of output radiation the plasma will produce.

The laser LA may not form part of the radiation source, i.e., it may be exterior and/or separate to the radiation source.

The laser LA emits two amounts of radiation that are incident on the fuel (and hence two corresponding amounts of laser energy are transferred into the fuel). The first amount of radiation emitted by the laser LA that is incident on the fuel may be referred to as a pre-pulse. The second amount of radiation emitted by the laser LA that is incident on the fuel may be referred to as a main pulse. The pre-pulse heats the fuel. In some cases the pre-pulse turns the fuel into a low density plasma. The pre-pulse may also shape the fuel. After the laser energy of the pre-pulse has been transferred to the fuel (i.e., once the fuel has been heated and/or shaped by the pre-pulse), the fuel may be referred to as a modified fuel distribution. The main pulse is then incident on the modified fuel distribution. The main pulse creates the highly ionized plasma 210 which emits a third amount of radiation. This third amount of radiation (also referred to as output radiation, for example EUV radiation) is collected and focussed by the collector optic CO and then propagates downstream through the lithographic apparatus as previously discussed.

Although the present embodiment of the present invention has a laser LA that provides the first and second amounts of radiation (pre-pulse and main pulse), in other embodiments of the present invention any other appropriate radiation source may provide the first and second amounts of radiation. In some embodiments of the present invention a separate radiation source (e.g., a separate laser) may provide each of the first and second amounts of radiation.

Radiation that is reflected by the collector optic CO is focused to a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210.

Subsequently the radiation traverses the illumination system IL. The illumination system IL may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, a patterned beam 26 is formed and the patterned beam 26 is imaged by the projection system PS via reflective elements 28, 30 onto a substrate W held by the substrate table WT.

More elements than shown may generally be present in the illumination system IL and projection system PS. Further, there may be more mirrors present than those shown in the Figures, for example there may be 1-6 additional reflective elements present in the projection system PS than shown in FIG. 2.

Returning now to the laser produced plasma portion of the apparatus, in some known lithographic apparatus (i.e., lithographic apparatus which does not form part of the present invention) the following processes take place. In some known lithographic apparatus there is no pre-pulse (i.e., first amount of radiation). That is to say that the fuel is not modified such that it becomes a modified fuel distribution before it is subjected to a main pulse of radiation. In other known lithographic apparatus a pre-pulse (i.e., first amount of radiation) is used and a modified fuel distribution is created. Common to both of these approaches, the main pulse which is provided to either the unmodified fuel or the modified fuel distribution respectively, is directed at the unmodified fuel or modified fuel distribution such that the main beam propagates in a direction which is perpendicular to the surface of the unmodified fuel or modified fuel distribution upon which it is incident.

There is considerable technical prejudice towards directing the main beam at the unmodified fuel or modified fuel distribution such that it propagates in a direction which is perpendicular to the surface of the unmodified fuel or modified fuel distribution upon which it is incident. This is because one of the mechanism utilised in transferring energy from the main pulse into the unmodified fuel or modified fuel distribution is at least one conventional absorption process such as Bremsstrahlung absorption. It is known that the conventional absorption of radiation into the unmodified fuel or modified fuel distribution is maximised when the main pulse is incident on the unmodified fuel or modified fuel distribution perpendicular to the surface of the unmodified fuel or modified fuel distribution upon which the main pulse is incident.

Although the amount of energy absorbed, due conventional absorption mechanisms, by the unmodified fuel or modified fuel distribution from the main pulse is maximised by the main pulse being incident perpendicular to the surface of the unmodified fuel or modified fuel distribution, the use of these conventional absorption mechanisms to produce output radiation (for example EUV radiation) has been found to be fairly inefficient. For example, less than 5% of the energy provided by the main pulse may be converted into useful output radiation. One of the reasons for this is that, although the amount of energy which is absorbed from the main pulse into the unmodified fuel or modified fuel distribution is maximised by the main pulse being incident perpendicular to the surface of the unmodified fuel or modified fuel distribution, there is poor coupling of energy from the main pulse into the unmodified fuel or modified fuel distribution. That is to say, the absorption (due to conventional absorption mechanisms) of the main pulse by the unmodified fuel or modified fuel distribution is low. In some cases, less than 50% of the energy of the main pulse is absorbed by the unmodified fuel or modified fuel distribution. This is due at least in part to the optical properties of the fuel. For example, the fuel (and hence any modified fuel distribution created from the fuel) may have a high reflectivity with respect to the radiation of the main pulse. For this reason, a significant amount of the main pulse may be reflected by the unmodified fuel or modified fuel distribution as opposed to being absorbed by the unmodified fuel or modified fuel distribution and hence utilised to create the highly ionised plasma and thence output radiation (for example EUV radiation). Not only does low absorption of the main pulse radiation by the unmodified fuel or modified fuel distribution reduce the amount of output radiation produced by the plasma but, as previously discussed, a significant portion of the main pulse radiation is reflected or transmitted by the unmodified fuel or modified fuel distribution.

Laser radiation which is reflected or transmitted by the unmodified fuel or modified fuel distribution may pass from the radiation source (source collector module CO) to portions of the lithographic apparatus which are downstream of the source collector module, for example, the illuminator, the projection system, the patterning device or the substrate. Laser radiation which passes from the radiation source to portions of the lithographic apparatus, which are downstream of the radiation source, may be referred to as out of band (OoB) radiation. OoB radiation may reduce the imaging performance of the lithographic apparatus and/or may lead to heating of portions of the lithographic apparatus, which may result in damage to the lithographic apparatus.

The applicant has found that, surprisingly and contrary to technical prejudice in the field, a mechanism other than conventional absorption mechanisms may be used to transfer radiation from the main pulse into the fuel.

Figure 3:
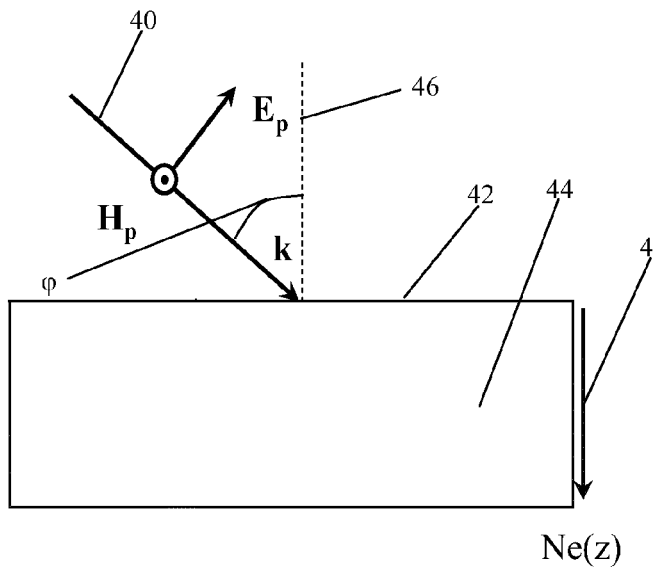
FIG. 3 is a schematic representation of a beam of radiation which is incident on a surface of a plasma.

FIG. 3 shows a schematic diagram of a beam of radiation 40 which is incident on a surface 42 of a plasma 44. The radiation beam 40 is p-polarised such that the electric field $E_p$ is parallel to the plane of incidence. The plane of incidence is the plane defined by the direction of travel of the radiation beam 40 and the normal 46 to the surface 42 of the plasma 44. The magnetic field $H_p$ is such that it is perpendicular to the plane of the Figure and is effectively coming out of the Figure towards the observer. The radiation beam 40 has a wave vector k which subtends an angle ϕ with respect to the normal 46 to the surface 42 of the plasma 44. The plasma 44 has an electron density gradient Ne in the z-direction indicated by arrow 48.

The applicant has appreciated that in the system shown in FIG. 3 plasma resonance absorption will occur. The amount of plasma resonance absorption $A_p$ is given by the relationship $$A_p \sim (k\delta)^{\frac{1}{3}} \sin(\varphi) \qquad (2)$$

in which k is the magnitude of the wave vector k of the incident laser radiation (the magnitude of the wave vector k of the incident laser radiation is given by $2\pi/\lambda$, where $\lambda$ is the wavelength of the incident laser radiation), $\delta$ is the plasma density scale length and $\varphi$ is the angle between the wave vector k of the incident laser radiation beam and the normal to the surface of the plasma (also referred to as the angle of incidence). The plasma density scale length $\delta$ is a measure of the rate of change of the density of the plasma (i.e., the density of ions and/or electrons). The shorter the plasma density scale length $\delta$, the greater the rate of change of plasma density. Conversely, the longer the plasma density scale length $\delta$, the less the rate of change of plasma density.

Figure 4:
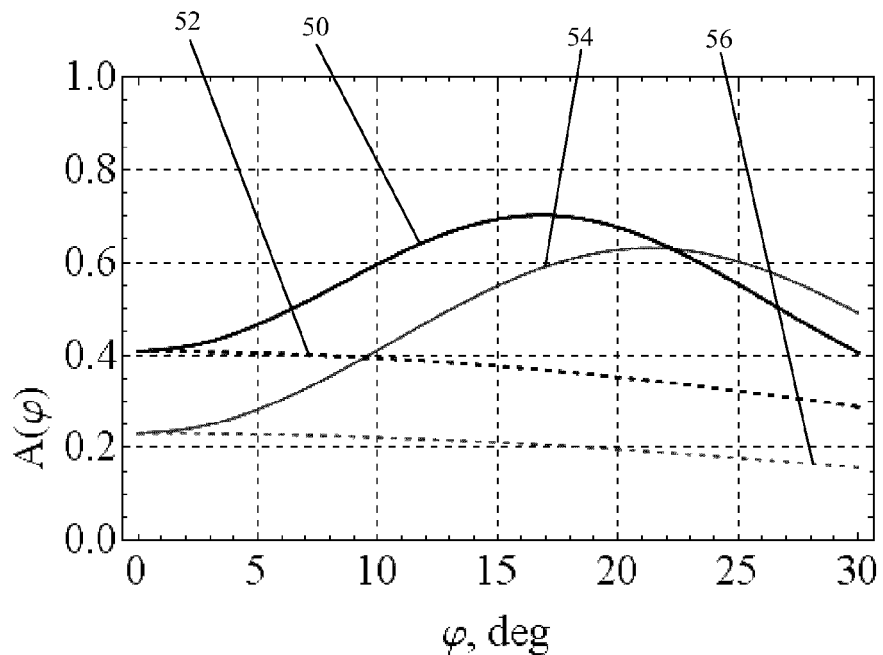
FIG. 4 is a graph showing the total absorption of two plasmas under different conditions.

FIG. 4 shows a graph of total absorption A (i.e., including plasma resonance absorption and absorption due to other mechanisms such as Bremsstrahlung absorption) as a function of the angle of incidence $\varphi$ in degrees. The total absorption A by the plasma is indicated as a proportion of the incident radiation, where 1 is complete absorption of the incident radiation by the plasma (i.e., 100% of the incident radiation is absorbed by the plasma) and 0 is no absorption of the incident radiation by the plasma.

Within the graph, lines 50 and 52 relate to plasma that has a plasma density scale length $\delta$ of 20; and lines 54 and 56 relate to plasma that has a plasma density scale length $\delta$ of 10. Within the graph, lines 50 and 54 relate to p-polarised (with respect to the surface of the plasma) radiation incident on the plasma; and lines 52 and 56 relate to s-polarised (with respect to the surface of the plasma) radiation incident on the plasma.

It can be seen from the graph that the total absorption A of s-polarised radiation by the plasma decreases as the angle of incidence $\varphi$ increases. However, the graph shows that for p-polarised incident radiation, as the angle of incidence $\varphi$ increases from 0, the total absorption A increases to a maximum and then decreases. In the example shown in the graph, the maximum total absorption A of p-polarised incident radiation by a plasma which a plasma density scale length $\delta$ of 20 (indicated by line 50) occurs at an incidence angle $\varphi$ of approximately 17°. Similarly, the maximum total absorption A of incident p-polarised radiation by a plasma with a plasma density scale length $\delta$ of 10 (represented by line 54) occurs at an incidence angle of approximately 22°.

For each of the lines (50, 54) of the graph relating incident p-polarised radiation, the difference between the maximum total absorption and the total absorption at an angle of incidence $\varphi$ equal to 0° is due extra absorption due to plasma resonance absorption. Plasma resonance absorption occurs when p-polarised radiation is incident on a plasma where the angle of incidence is not equal to 0°. It can be seen from the graph that, for a plasma having a plasma density scale length $\delta$ of 20 with incident p-polarised radiation (as represented by line 50), plasma resonance absorption increases the total absorption A from approximately 0.4 at an incidence angle $\varphi$ of 0° to approximately 0.7 at an incidence angle $\varphi$ of about 17°. Similarly, for a plasma with a plasma density scale length $\delta$ of 10 and with incident p-polarised radiation (represented by line 54), plasma resonance absorption increases the total absorption A from about 0.23 at an angle of incidence $\varphi$ of 0° to about 0.63 at an angle of incidence $\varphi$ of about 22°.

It will be appreciated that the total absorption A of radiation incident on a plasma will be dependent upon the wavelength of the incident radiation, the angle of incidence of the incident radiation and the plasma density scale length. Furthermore, it will be appreciated that the incidence angle at which the maximum total absorption A occurs for any given wavelength of radiation incident on a plasma will be dependent on the wavelength of the incident radiation and the plasma density scale length. Typically, for greater plasma density scale lengths, the angle of incidence at which maximum total absorption will occur is smaller (i.e., closer to 0°). Greater plasma density scale lengths are likely to occur in plasmas which are created (for example, by a pre-pulse) by lasers using a long laser pulse duration and/or a long laser wavelength.

The present invention utilises the surprising discovery of the applicant that radiation incident on the plasma at an incidence angle which is not perpendicular to the surface of the fuel upon which the radiation is incident, will produce an increase in total absorption by the fuel due to plasma resonance absorption.

Figure 5:
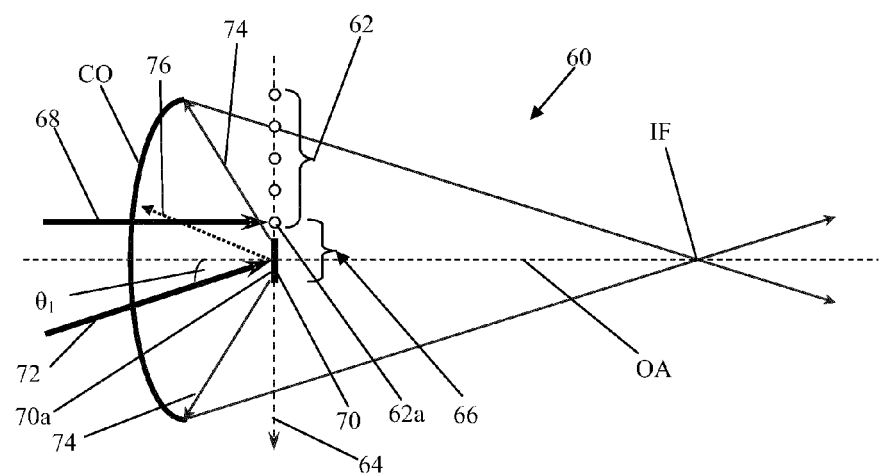
FIG. 5 is a schematic cross-sectional view of a radiation source in accordance with a first embodiment of the present invention.

FIG. 5 shows a schematic representation of a portion of a radiation source 60 in accordance with an embodiment of the present invention. The radiation source 60 comprises a nozzle (not shown) configured to direct a stream of fuel droplets 62 along a trajectory 64 towards a plasma formation location 66. The radiation source 60 is configured to receive a first amount of radiation 68 (which may also be referred to as a pre-pulse) from a first secondary radiation source (not shown). The first secondary radiation source may form part of the radiation source 60 or may be separate to the radiation source 60. The first amount of radiation is incident on a fuel droplet 62a at the plasma formation location 66. The first amount of radiation 68 transfers energy into the fuel droplet 62 to generate a modified fuel distribution 70.

It can be seen that the modified fuel distribution 70 is displaced along the trajectory 64 from the point at which the fuel droplet 62a has the first amount of radiation 68 incident on it. FIG. 5 shows the modified fuel distribution 70 formed from a fuel droplet (not shown because it has been modified by the first amount of radiation to form the modified fuel distribution) by the first amount of radiation. The modified fuel distribution 70 moves under the effect of gravity from the point at which the modified fuel distribution 70 was created by the first amount of radiation 68 being incident on the fuel droplet from which it was created. In some embodiments of the present invention the modified fuel distribution may stay at the same location at which it was created by having the first amount of radiation 68 incident on its respective fuel droplet. As well as the modified fuel distribution 70, FIG. 5 simultaneously shows a subsequent fuel droplet (i.e., a fuel droplet emitted by the nozzle (not shown) after the fuel droplet which has generated the modified fuel distribution 70) upon which a first amount of radiation 68 is incident.

The first amount of radiation 68 is directed generally towards the centre of the fuel droplet 62a, such that the modified fuel distribution 70 that is generated by the transfer of energy from the first amount of radiation 68 into the fuel droplet 62a expands outwards from its centre in a plane which is generally perpendicular to the propagation direction of the first amount of radiation 68. Consequently, the modified fuel distribution 70 in this case is generally disk-shaped (although this is not visible in FIG. 5 due to the fact that FIG. 5 shows a cross-section through the disc). The modified fuel distribution 70 has a first generally flat (or generally plainer) surface 70a.

It will be appreciated that the term "surface" should be interpreted broadly so as to include not only a single continuous surface, but also a surface that is made up of a plurality of discreet surfaces (for example the surfaces of many small droplets of fuel, such as a mist of fuel). The term "surface" should also be interpreted broadly such that it not only covers a distinct surface which is the interface between two different materials, but also such that it covers an indistinct surface such as a density gradient of plasma particles, as is the case in the present embodiment. The density gradient of plasma particles in the present case is a density gradient such that the density of the plasma particles of the surface of the modified fuel distribution decreases with increasing distance away from the centre of the modified fuel distribution.

The modified fuel distribution 70 may be referred to as a mist and may have a typical diameter of about 500 to about 600 micrometers. However, it will be appreciated that in other embodiments of the present invention, the dimensions of the modified fuel distribution—or mist—may be different.

The radiation source 60 is also configured to receive a second amount of radiation 72 (also referred to as a main pulse) from a second secondary radiation source (not shown). The second secondary radiation source may form part of the radiation source 60 or may be separate to the radiation source 60. The first and second secondary radiation sources may be separate or, as is the case in the present embodiment, may be a single secondary radiation source. In the present embodiment, the first and second secondary radiation sources are a laser which outputs radiation at an infrared (IR) wavelength. For example, the first and second secondary radiation sources may comprise a carbon dioxide (CO2) or yttrium aluminium garnet (YAG) laser. It will be appreciated that, in other embodiments of the present invention, any appropriate wavelength of radiation may be produced by the first and second secondary radiation sources.

The second amount of radiation 72 is incident on a portion of the first surface 70a (also referred to as the surface) of the modified fuel distribution 70. The second amount of radiation 72 has a p-polarised component with respect to the portion of the surface 70a of the modified fuel distribution 70.

In this embodiment of the present invention, the second amount of radiation 72 is linearly p-polarised such that the second amount of radiation 72 is entirely p-polarised. However, in other embodiments of the present invention, the second amount of radiation 72 may be circularly polarised or randomly polarised, provided that the second amount of radiation has a component which is p-polarised with respect to the portion of the surface 70a of the modified fuel distribution 70. It will be appreciated that the greater the proportion of the radiation that is p-polarised, the greater the amount of plasma resonance absorption the will occur.

The second amount of radiation 72 transfers energy to the modified fuel distribution 70 to generate a radiation generating plasma. The radiation generating plasma emits a third amount of radiation (indicated generally by arrows 74). In the case of the present embodiment of the present invention, the third amount of radiation 74 is EUV radiation. However, it will be appreciated that in other embodiments of the present invention, the third amount of radiation may be any appropriate type of radiation having any appropriate wavelength.

The radiation source 60 further comprises a collector in the form of a collector optic CO which is configured to collect and direct (and/or focus) at least a portion of the third amount of radiation 74. The collector directs at least a portion of the third amount of radiation 74 towards an intermediate focus IF along an optical axis OA.

Within the present embodiment, the surface 70a of the modified fuel distribution 70 which is created by the transfer of energy between the first amount of radiation 68 and the fuel droplet 62a is aligned such that it is substantially perpendicular to the optical axis OA. That is to say, the normal to the portion of the surface 70a upon which the second amount of radiation 72 is incident is substantially parallel to (or coaxial with) the optical axis OA. Within the present embodiment, the second amount of radiation 72 propagates in a first direction. The first direction subtends an angle $\theta_1$ with respect to the normal to the portion of the surface 70a of the modified fuel distribution 70.

In this embodiment, due to the fact that the normal to the portion of the surface of the modified fuel distribution upon which the second amount of radiation is incident is substantially parallel to (or coaxial with) the optical axis, the first direction also subtends an angle of $\theta_1$ with respect to the optical axis OA.

In this embodiment of the present invention, as with other embodiments of the present invention, the second amount of radiation 72 propagates in the first direction, the first direction being non-parallel to the normal to the portion of the surface 70a of the modified fuel distribution 70 upon which the second amount of radiation 72 is incident.

The embodiment of the present invention shown in FIG. 5 has the advantage that the distribution of the third amount of radiation 74 which is produced by the transfer of energy from the second amount of radiation 72 into the modified fuel distribution 70 is generally symmetric with respect to the optical axis OA of the collector optic CO. This is because the normal to the portion of the surface 70a of the modified fuel distribution 70 is substantially parallel to the optical axis OA of the collector optic CO. The advantage of the distribution of the third amount of radiation 74 being generally symmetric with respect to the optic axis OA of the collector optic CO is that this may reduce the complexity of optics required downstream of the radiation source in order to obtain a patterned beam which has the desired intensity distribution.

Figure 6:
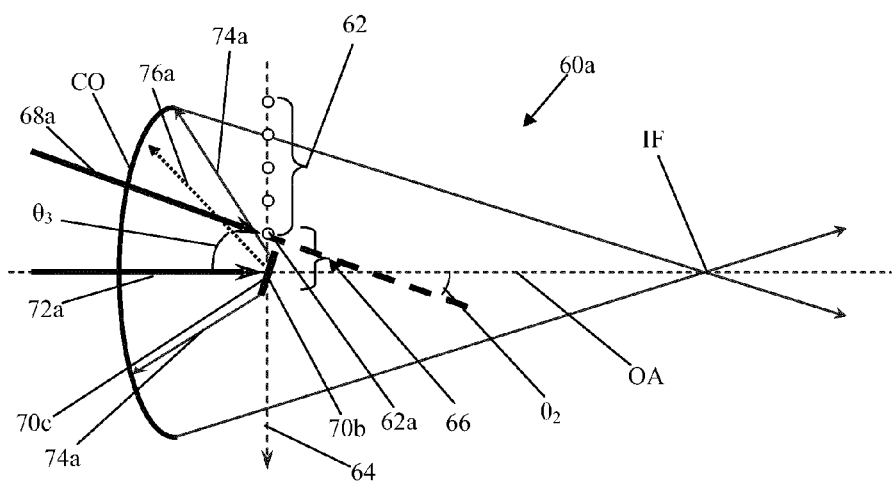
FIG. 6 is a schematic cross-sectional view of a radiation source in accordance with a second embodiment of the present invention.

FIG. 6 shows an alternative embodiment of the present invention. Features of the embodiment shown in FIG. 6 which are substantially the same as those of the embodiment of the present invention shown in FIG. 5 have been given the same numbering. The basic principles of operation of the radiation source 60a shown in FIG. 6 are substantially the same as those of the radiation source 60 shown in FIG. 5. The radiation source 60a shown in FIG. 6 differs from that shown in FIG. 5 in that the first amount of radiation 68a is incident on the fuel droplet 62a at the plasma formation location 66, the first amount of radiation 68a propagating in a direction which subtends an angle of $\theta_2$ (where $\theta_2$ does not equal 0°) with respect to the optical axis OA. Within the present embodiment there is a modified fuel distribution 70b which has a surface 70c. As before, the first amount of radiation 68a is incident substantially on the centre of the fuel droplet 62a such that the energy transferred from the first amount of radiation 68a to the fuel droplet 62a causes the modified fuel distribution 70b to extend outwards from the centre of the modified fuel distribution 70b substantially within a plane that is substantially perpendicular to the direction of propagation of the first amount of radiation 68a. Because of this, in this embodiment, the normal to the portion of the surface 70c of the modified fuel distribution 70b upon which the second amount of radiation 72a is incident, subtends the angle $\theta_2$ with respect to the optical axis OA of the radiation source 60a.

Within the embodiment of the present invention shown in FIG. 6, unlike the embodiment of the present invention shown in FIG. 5, the second amount of radiation 72*a* propagates in a direction which is substantially parallel to (or coaxial with) the optical axis OA of the radiation source 60*a*.

Although the directions of propagation of the first and second amounts of radiation 68*a* and 72*a* with respect to the optical axis OA of the radiation source 60*a* are different for this embodiment compared to the embodiment shown in FIG. 5, it will be appreciated that in common with all embodiments of the present invention, the second amount of radiation 72*a* propagates in a direction which is non-parallel to the normal to the portion of the surface 70*c* of the modified fuel distribution 70*b* upon which the second amount of radiation 72*a* is incident.

In common with all embodiments of the present invention, the second amount of radiation 72*a* of the embodiment shown in FIG. 6 has a p-polarised component with respect to the portion of the surface 70*c* of the modified fuel distribution 70*b* upon which the second amount of radiation 72*a* is incident.

The embodiment of the present invention shown in FIG. 6 has several advantages. These are discussed below. As previously discussed, the first amount of radiation 68*a* in this embodiment does not propagate in a direction which is parallel to the optical axis OA. Hence, the energy transferred from the first amount of radiation 68*a* into the fuel droplet 62*a* causes the modified fuel distribution 70*b* to be created substantially in a plane, the normal to which is non-parallel to the optical axis OA of the radiation source 60*a*. Consequently, the normal to the surface 70*c* of the modified fuel distribution 70*b* is also non-parallel to the optical axis OA of the radiation source 60*a*. Because of this, the portion of the second amount of radiation 72*a* which is reflected by the modified fuel distribution 70*b* travels in a direction (indicated by arrow 76*a*) which subtends an angle from the optical axis OA which is indicated by $\theta_3$. The angle $\theta_3$ is twice the angle $\theta_2$. In comparison, the portion of the second amount of radiation which is reflected by the modified fuel distribution 70 of the embodiment shown in FIG. 5 travels in a direction (indicated by arrow 76) which subtends an angle equal to $\theta_1$ relative to the optical axis OA of the radiation source 60. That is to say that the embodiment in FIG. 5 is such that the angle subtended between the propagation direction of the portion of the second amount of radiation 72 which is reflected by the modified fuel distribution 70, and the optical axis OA is equal to the angle subtended between the propagation direction of the second amount of radiation and the optical axis OA. In comparison, the embodiment of the present invention shown in FIG. 6 is such that the angle subtended between the propagation direction of the portion of the second amount of radiation 72*a* which is reflected by the modified fuel distribution 70*b*, and the optical axis OA is equal to twice the angle subtended between the propagation direction of the first amount of radiation and the optical axis OA.

Due to the fact that the direction of the reflected radiation 76*a* of the embodiment shown in FIG. 6 subtends an angle $\theta_3$ to the optical axis OA that is twice the angle subtended between the propagation direction of the first amount of radiation and the optical axis OA, it is more likely the direction of propagation of the reflected portion of the second amount of radiation (indicated by 76*a*) in the embodiment shown in FIG. 6 will subtend a greater angle to the optical axis OA compared to that of the embodiment shown in FIG. 5. Due to the fact that the reflected portion of the second amount of radiation (indicated by 76*a*) in the embodiment shown in FIG. 6 will subtend a greater angle to the optical axis OA there will be a greater angular separation between the reflected portion of the second amount of radiation (out of band, non-useful radiation) and the third amount of radiation (useful, output radiation). The greater angular separation between the out of band radiation and the output radiation may make it simpler to separate the out of band radiation from the output radiation (and hence remove the out of band radiation) using optics such as spectral purity filters, such that the out of band radiation does not reach portions of the lithographic apparatus downstream of the radiation source.

Due to the fact that the modified fuel distribution 70*b* of the embodiment shown in FIG. 6 expands in a plane when it is generated that is non-parallel to the trajectory 64 of the fuel droplets, the modified fuel distribution 70*b* is less likely to interact with a subsequent (adjacent) fuel droplet 62*a*. If the modified fuel distribution 70*b* interacts with a subsequent fuel droplet 62*a*, then the modified fuel distribution 70*b* may cause the positioning and/or trajectory of the subsequent fuel droplet 62*a* to be altered. If this is the case then the positional accuracy of the subsequent fuel droplet 62*a* relative to the first amount of radiation 68*a* may be adversely affected. For example, the trajectory of the subsequent fuel droplet 62*a* may be affected by the modified fuel distribution 70*b* to the extent that the first amount of radiation 68*a* is not incident on the subsequent fuel droplet 62*a*. If the first amount of radiation 68*a* is not incident on the subsequent fuel droplet 62*a* then the subsequent fuel droplet 62*a* cannot generate its own modified fuel distribution and cannot therefore be used to generate plasma and consequently output radiation.

In addition, within the embodiment shown in FIG. 6, due to the fact that the modified fuel distribution 70*b* is less likely to interact with a subsequent (adjacent) fuel droplet 62*a*, it may be possible for the nozzle to operate at an increased fuel droplet creation rate (i.e., with less separation between adjacent fuel droplets), which will consequently increase the amount of output radiation that can be produced by the radiation source in a given time.

Within the embodiment of the present invention shown in FIG. 6, the modified fuel distribution 70*b* is created by the first amount of radiation 68*a* which propagates in a direction which subtends an angle $\theta_2$ relative to the optical axis OA. In order to create the modified fuel distribution 70*a*, the first amount of radiation 68*a* is substantially incident on the centre fuel droplet which form the modified fuel distribution. This results in a modified fuel distribution 70*b* which has a surface 70*c*, the normal to which is non-parallel to the optical axis OA. In other words, the angle between the normal to the surface 70*c* and the optical axis OA results from the angle between the propagation direction of the first amount of radiation and the optical axis OA. Another way of creating a modified fuel distribution which has a surface, the normal to which is non-parallel to the optical axis OA is to produce a first amount of radiation that propagates in a direction which is substantially parallel to (or coaxial with) the optical axis OA, but direct the first amount of radiation such that it is incident on an off-centre portion of the fuel droplet.

Figure 7:
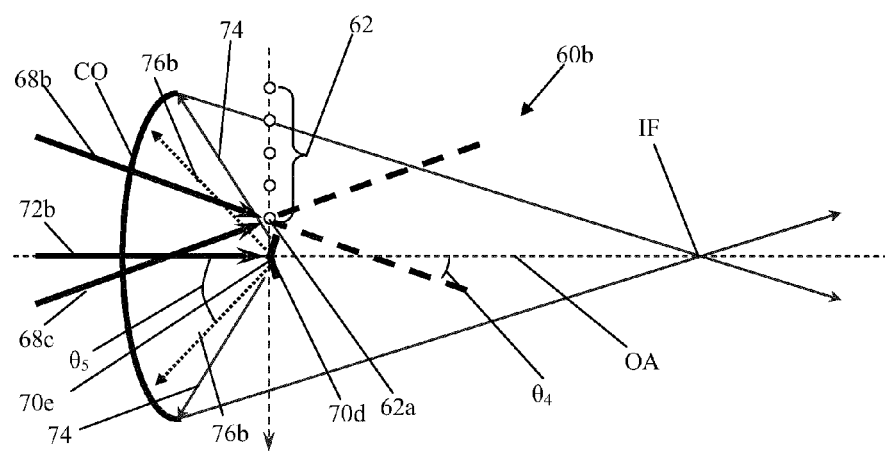
FIG. 7 is a schematic cross-sectional view of a radiation source in accordance with a third embodiment of the present invention.

FIG. 7 shows an alternative embodiment of a radiation source 60*b* in accordance with the present invention. As before, features of the embodiment shown in FIG. 7 which are substantially the same as those of the embodiment of the present invention shown in FIGS. 5 and 6 have been given the same numbering. The basic principles of operation of the radiation source 60*b* shown in FIG. 7 are substantially the same as those of the radiation sources 60, 60*a* shown in FIGS. 5 and 6. The radiation source 60*b* shown in FIG. 7 differs from that shown in FIG. 6 in that the modified fuel distribution 70*d* has as different general shape. The modified fuel distribution 70d is generally cone shaped (also referred to as having a generally conical shape). The modified fuel distribution 70d is shown in schematic cross section in FIG. 7. The generally cone shaped modified fuel distribution 70d has an apex which lies on the optical axis OA of the radiation source 60b. The axis of the generally cone shaped modified fuel distribution 70d is substantially co-axial with the optical axis OA of the radiation source 60b. It will be appreciated that, in other embodiments of the present invention, any appropriate location and/or orientation of the generally cone shaped modified fuel distribution relative to the optical axis OA of the radiation source may be used. The generally cone shaped modified fuel distribution 70d has a generally conical surface 70e. The generally cone shaped modified fuel distribution 70d has a generally v-shaped cross-section.

The modified fuel distribution 70d may be generated in an appropriate manner. In the case of the present embodiment, the modified fuel distribution 70d is generated by directing two similar separate first amounts of radiation 68b, 68c (also referred to as two similar separate pre-pulses) at the fuel droplet 62a. Each of the two similar separate first amounts of radiation 68b, 68c subtends an angle $\theta_4$ with respect to the optical axis OA of the radiation source 60b. The separate first amounts of radiation 68b and 68c are angularly separated from one another about the optical axis OA by an angle of 180°. The separate first amounts of radiation may be incident on the fuel droplet 62a at the same time or one after the other. The separate first amounts of radiation may be supplied by a single first secondary radiation source (not shown) or by two separate first radiation sources (also not shown).

In other embodiments of the present invention, it may be possible to generate the modified fuel distribution 70d using two separate collinear first amounts of radiation having particular characteristics.

The second amount of radiation 72b of the embodiment of the present invention shown in FIG. 7 propagates in a direction which is substantially co-axial to the optical axis OA. A normal to a portion of the generally conical surface 70e of the modified fuel distribution 70d subtends an angle $\theta_4$ with respect to the optical axis OA. Consequently, the second amount of radiation 72b is incident on the generally conical surface 70e such that the direction of propagation of the second amount of radiation subtends an angle of $\theta_4$ with respect to the normal to a portion of the surface 70e of the modified fuel distribution 70d.

The embodiment of the present invention shown in FIG. 7 is advantageous because that the distribution of the third amount of radiation 74 which is produced by the transfer of energy from the second amount of radiation 72b into the modified fuel distribution 70d is generally symmetric with respect to the optical axis OA of the collector optic CO (and hence the optical axis OA of the radiation source 60b). This is because apex of the modified fuel distribution 70d lies on the optical axis OA and the axis of the modified fuel distribution 70d is coaxial with the optical axis OA of the collector optic CO (and hence the optical axis OA of the radiation source 60b). The advantage of the distribution of the third amount of radiation 74 being generally symmetric with respect to the optic axis OA of the collector optic CO (and hence the optical axis OA of the radiation source 60b) is that this may reduce the complexity of optics required downstream of the radiation source in order to obtain a patterned beam which has the desired intensity distribution.

Furthermore, the embodiment of the present invention shown in FIG. 7 is advantageous because, in common with the embodiment shown in FIG. 6, the portion of the second amount of radiation 72b which is reflected by the modified fuel distribution 70d travels in a direction (indicated by arrow 76b) which subtends an angle $\theta_5$ with respect to the optical axis OA which is twice the angle $\theta_4$ that is subtended between the direction of propagation of either of the first amounts of radiation 68b, 68c and the optical axis OA. Due to the fact that the direction of the reflected radiation 76b of the embodiment shown in FIG. 7 subtends an angle $\theta_5$ to the optical axis OA that is twice the angle subtended between the propagation direction of either of the first amounts of radiation 68b, 68c and the optical axis OA, it is more likely the direction of propagation of the reflected portion of the second amount of radiation (indicated by 76b) in the embodiment shown in FIG. 7 will subtend a greater angle to the optical axis OA compared to, say, that of the embodiment shown in FIG. 5. Due to the fact that the reflected portion of the second amount of radiation (indicated by 76b) in the embodiment shown in FIG. 7 will subtend a greater angle to the optical axis OA there will be a greater angular separation between the reflected portion of the second amount of radiation 76b (out of band, non-useful radiation) and the third amount of radiation 74 (useful, output radiation). The greater angular separation between the out of band radiation 76b and the output radiation 74 may make it simpler to separate the out of band radiation 76b from the output radiation 74 (and hence remove the out of band radiation) using optics such as spectral purity filters such that the out of band radiation does not reach portions of the lithographic apparatus downstream of the radiation source.

Figure 8:
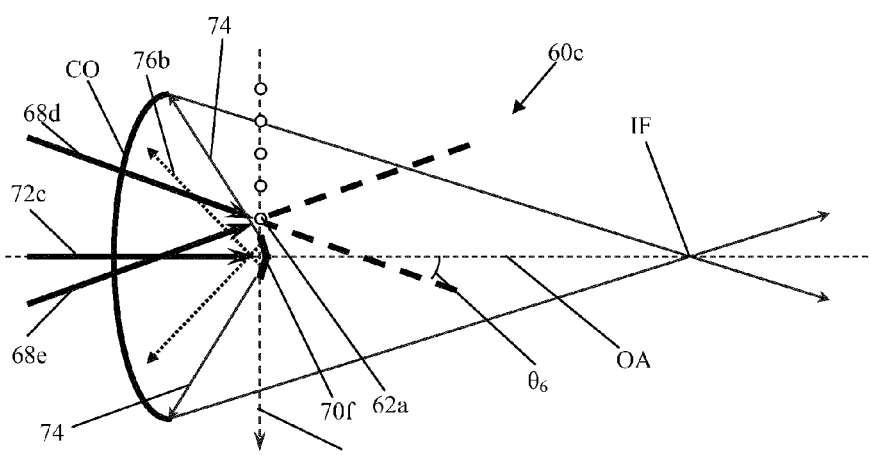
FIG. 8 is a schematic cross-sectional view of a radiation source in accordance with a fourth embodiment of the present invention.

FIG. 8 shows an alternative embodiment of a radiation source 60c in accordance with the present invention which is similar to the embodiment shown in FIG. 7. As before, features of the embodiment shown in FIG. 8 which are substantially the same as those of the embodiment of the present invention shown in FIGS. 5 to 7 have been given the same numbering. The basic principles of operation of the radiation source 60c shown in FIG. 8 are substantially the same as those of the radiation source 60b shown in FIG. 7. The radiation source 60b shown in FIG. 8 differs from that shown in FIG. 7 in that the modified fuel distribution 70f has as different orientation.

As with the modified fuel distribution 70d of the embodiment shown in FIG. 7, the modified fuel distribution 70f is generally cone shaped (also referred to as having a generally conical shape). The modified fuel distribution 70f is shown in schematic cross section in FIG. 8. The generally cone shaped modified fuel distribution 70f has an apex which lies on the optical axis OA of the radiation source 60c. The axis of the generally cone shaped modified fuel distribution 70f is substantially co-axial with the optical axis OA of the radiation source 60c. Contrary to the embodiment shown in FIG. 7, in which the apex of the generally conical modified fuel distribution 70d is closer to the source (not shown) of the second amount of radiation 72b than the base (not shown) of the generally conical modified fuel distribution 70d, the base (not shown) of the generally conical modified fuel distribution 70f is closer to the source (not shown) of the second amount of radiation 72c than the apex of the generally conical modified fuel distribution 70f. In FIG. 7, it may be the that the apex of the generally conical modified fuel distribution 70d is such that the modified fuel distribution 70d points towards the collector optic CO. In FIG. 8, it may be the that the apex of the generally conical modified fuel distribution 70f is such that the modified fuel distribution 70f points towards the intermediate focus IF. The generally cone shaped modified fuel distribution 70f has a generally v-shaped cross-section, but due to its orientation, it may be referred to as having an inverted v-shaped cross-section.

The embodiment shown in FIG. 8 has the benefits discussed in relation to the embodiment shown in FIG. 7.

The modified fuel distribution 70f may be generated in an appropriate manner. In the case of the present embodiment, the modified fuel distribution 70f is generated by directing two similar separate first amounts of radiation 68d, 68e (also referred to as two similar separate pre-pulses) at the fuel droplet 62a. Each of the two similar separate first amounts of radiation 68d, 68e subtends an angle $\theta_6$ with respect to the optical axis OA of the radiation source 60c. The separate first amounts of radiation 68d and 68e are angularly separated from one another about the optical axis OA by an angle of 180°. The separate first amounts of radiation may be incident on the fuel droplet 62a at the same time or one after the other. The separate first amounts of radiation may be supplied by a single first secondary radiation source (not shown) or by two separate first radiation sources (also not shown).

Although the first amounts of radiation 68d, 68e shown in the embodiment of FIG. 8 propagate from a location which is the opposite side of the collector optic CO to that of the intermediate focus IF, in other embodiments, the first amounts of radiation may propagate from a location which is the same side of the collector optic CO as that of the intermediate focus IF.

Within the embodiments shown in FIGS. 7 and 8, the modified fuel distributions 70d and 70f have a generally conical shape. In this manner, the generally conical shaped modified fuel distributions 70d and 70h have generally v-shaped cross-sections. In other embodiments of the present invention, the modified fuel distribution may have a generally spherical cap shape. Such generally spherical cap shaped modified fuel distributions will have a generally curved or arc-shaped cross-section. A generally spherical cap shaped modified fuel distribution may have a similar orientation to that of the modified fuel distributions of the embodiments shown in FIGS. 7 and 8.

Within all the embodiments described above, it has been found that, in order to maximise the proportion of the energy of the second amount of radiation that is absorbed by the modified fuel distribution (due to plasma resonance absorption), certain conditions are particularly effective. For example, a particular range of angles between the direction of propagation of the second amount of radiation and the normal to the portion of the surface of the modified fuel distribution upon which the second amount of radiation is incident may be particularly effective in maximising the energy absorbed by the modified fuel distribution under certain conditions. For example, in the case where the fuel (and hence modified fuel distribution) is tin (Sn) and the wavelength of the second amount of radiation is approximately 10.6 nm, an angle between the direction of propagation of the second amount of radiation and the normal to the portion of the surface of the modified fuel distribution upon which the second amount of radiation is incident of between about 10° and about 30° has been found to be particularly effective. In some embodiments of the present invention, the angle between the direction of propagation of the second amount of radiation and the normal to the portion of the surface of the modified fuel distribution upon which the second amount of radiation is incident may be at least one of between: about 5° and about 35°, about 10° and about 25°, about 10° and about 20°, about 10° and about 15°, about 15° and about 30°, about 15° and about 25°, about 15° and about 20°, about 20° and about 30°, and about 20° and about 25°.

In some embodiments of the present invention, before operating the radiation source in a lithographic process, the angle between the direction of propagation of the second amount of radiation and the normal to the portion of the surface of the modified fuel distribution upon which the second amount of radiation is incident, at which a maximum amount of energy is transferred from the second amount of radiation to the modified fuel distribution due to plasma resonance may be determined Based on this determination, the radiation source may then be operated so that the angle between the direction of propagation of the second amount of radiation and the normal to the portion of the surface of the modified fuel distribution upon which the second amount of radiation is incident is the angle at which the maximum amount of energy is transferred from the second amount of radiation to the modified fuel distribution due to plasma resonance.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

The term "radiation" may be taken to encompass any appropriate type of radiation including electromagnetic radiation or particle radiation (typically, fast moving charged particles). For example, the first amount of radiation provided to the fuel droplet may, in some embodiments of the present invention, be an electron beam.

While specific embodiments of the present invention have been described above, it will be appreciated that the present invention may be practised otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A radiation source suitable for providing a beam of radiation to an illuminator of a lithographic apparatus, the radiation source comprising:
a nozzle configured to direct a stream of fuel droplets along a trajectory towards a plasma formation location; and
the radiation source being configured to receive a first amount of radiation such that the first amount of radiation is incident on a fuel droplet at the plasma formation location, and such that the first amount of radiation transfers energy into the fuel droplet to generate a modified fuel distribution, the modified fuel distribution having a surface;
the radiation source being configured to receive a second amount of radiation such that the second amount of radiation is incident on a portion of the surface of the modified fuel distribution, wherein
the second amount of radiation has a p-polarized component with respect to the portion of the surface,
a controller configured to determine a range of angles between (i) a first direction, at which the second amount of radiation propagates, and (ii) a normal to the portion of the surface of the modified fuel distribution at which a maximum amount of energy is transferred from the second amount of radiation to the modified fuel distribution due to plasma resonance, the first direction being non-parallel to the normal to the portion of the surface of the modified fuel distribution, and
the second amount of radiation propagates in the first direction, at which the maximum amount of energy is transferred, and transfers energy to the modified fuel distribution to generate a radiation generating plasma, the radiation generating plasma emitting a third amount of radiation; and
the radiation source further comprising a collector configured to collect and direct at least a portion of the third amount of radiation.

2. The radiation source of claim 1, wherein the radiation source comprises at least one secondary radiation source, the at least one secondary radiation source generating the first and second amounts of radiation.

3. The radiation source of claim 2, wherein the at least one secondary radiation source comprises a first secondary radiation source and a second secondary radiation source, the first secondary radiation source being configured to generate the first amount of radiation and the second secondary radiation source configured to generate the second amount of radiation.

4. The radiation source of claim 2, wherein the at least one secondary radiation source comprises a CO2 or YAG laser.

5. The radiation source of claim 1, wherein the radiation source is configured such that the angle between the first direction and the normal to the portion of the surface of the modified fuel distribution is between about 10° and about 30°.

6. The radiation source of claim 1, wherein the radiation source is configured such that the second amount of radiation is one of linearly p-polarized, circularly polarized or randomly polarized.

7. The radiation source of claim 1, wherein the radiation source is configured such that the modified fuel distribution is generally disk shaped and the portion of the surface of the modified fuel distribution is generally planar.

8. The radiation source of claim 1, wherein the radiation source is configured such that the modified fuel distribution is generally conical or of a generally spherical cap shape, the portion of the surface modified fuel distribution being a generally conical surface or is generally the surface of a spherical cap respectively.

9. The radiation source of claim 1, wherein the fuel droplets comprise xenon, tin or lithium.

10. A lithographic apparatus arranged to project a pattern from a patterning device onto a substrate, wherein the lithographic apparatus comprises at least one secondary radiation source and a radiation source configured to provide a beam of radiation to the patterning device along an optical axis, the radiation source comprising:
a nozzle configured to direct a stream of fuel droplets along a trajectory towards a plasma formation location; and
the radiation source being configured to receive a first amount of radiation from the at least one secondary radiation source such that the first amount of radiation is incident on a fuel droplet at the plasma formation location, and such that the first amount of radiation transfers energy into the fuel droplet to generate a modified fuel distribution, the modified fuel distribution having a surface;
the radiation source being configured to receive a second amount of radiation from the at least one secondary radiation source such that the second amount of radiation is incident on a portion of the surface of the modified fuel distribution, wherein the second amount of radiation has a p-polarized component with respect to the portion of the surface, a controller configured to determine a range of angles between (i) a first direction, at which the second amount of radiation propagates, and (ii) a normal to the portion of the surface of the modified fuel distribution at which a maximum amount of energy is transferred from the second amount of radiation to the modified fuel distribution due to plasma resonance, the first direction being non-parallel to the normal to the portion of the surface of the modified fuel distribution, and the second amount of radiation propagates in the first direction, at which the maximum amount of energy is transferred, and transfers energy to the modified fuel distribution to generate a radiation generating plasma, the radiation generating plasma emitting a third amount of radiation; and the radiation source further comprising a collector configured to collect and direct at least a portion of the third amount of radiation along the optical axis towards the patterning device.

11. The lithographic apparatus of claim 10, wherein the normal to the portion of the surface of the modified fuel distribution is parallel to the optical axis.

12. The lithographic apparatus of claim 10, wherein the first direction is parallel to the optical axis.

13. A device manufacturing method using a lithographic apparatus, the lithographic apparatus comprising at least one secondary radiation source, a patterning device and a radiation source having a nozzle, a plasma formation location and a collector, the method comprising:

directing a stream of fuel droplets from the nozzle along a trajectory towards the plasma formation location;

producing a first amount of radiation from the at least one radiation source such that the first amount of radiation is incident on a fuel droplet at the plasma formation location;

transferring energy from the first amount of radiation into the fuel droplet to generate a modified fuel distribution, the modified fuel distribution having a surface;

producing a second amount of radiation having a p-polarized component with respect to a portion of the surface from the at least one radiation source such that the second amount of radiation is incident on the portion of the surface of the modified fuel distribution, wherein the second amount of radiation propagates in a first direction, the first direction being non-parallel to a normal to the portion of the surface of the modified fuel distribution;

determining an angle between the first direction and the normal to the portion of the surface of the modified fuel distribution at which a maximum amount of energy is transferred from the second amount of radiation to the modified fuel distribution due to plasma resonance, wherein the second amount of radiation propagates in the first direction at the angle at which the maximum amount of energy is transferred;

transferring energy from the second amount of radiation to the modified fuel distribution to generate a radiation generating plasma, the radiation generating plasma emitting a third amount of radiation;

collecting at least a portion of the third amount of radiation at the collector to produce a radiation beam;

directing the radiation beam from the collector along an optical axis towards the patterning device, producing a patterned radiation beam using the patterning device; and projecting the patterned radiation beam onto a substrate.

* * * * *